United States Patent [19]

Aoki et al.

[11] 4,114,254

[45] Sep. 19, 1978

[54] METHOD FOR MANUFACTURE OF A SEMICONDUCTOR DEVICE

[75] Inventors: Teruaki Aoki, Tokyo; Motoaki Abe, Hiratsuka, both of Japan

[73] Assignee: Sony Corporation, Tokyo, Japan

[21] Appl. No.: 669,326

[22] Filed: Mar. 22, 1976

[30] Foreign Application Priority Data

Apr. 17, 1975 [JP] Japan ............................... 50-46698

[51] Int. Cl.² ............................................ B01J 17/00
[52] U.S. Cl. ...................................... 29/571; 29/578; 357/59
[58] Field of Search .................. 29/571, 578; 357/23, 357/59

[56] References Cited

U.S. PATENT DOCUMENTS 4,001,873   1/1977   Kajiwara ............... 357/59

OTHER PUBLICATIONS

IBM Technical Disclosure Bulletin, "Doped Polycystalline Field Shield Process," Abbas et al., p. 1981, vol. 15, No. 6, Nov. 1972.

*Primary Examiner*—W. Tupman
*Attorney, Agent, or Firm*—Hill, Gross, Simpson, Van Santen, Steadman, Chiara & Simpson

[57] ABSTRACT

A semiconductor device and method of making the same is disclosed having a surface passivation film of a polycrystalline silicon layer containing 2 to 45 atomic percent of oxygen atoms.

The polycrystalline silicon layer is locally electrically insulated by oxidizing throughout the thickness of the layer.

The local oxidizing treatment causes the polycrystalline or silicon layer to pattern.

10 Claims, 15 Drawing Figures

METHOD FOR MANUFACTURE OF A SEMICONDUCTOR DEVICE

FIELD OF THE INVENTION

This invention relates to a method of making a semiconductor device on which a polycrystalline silicon layer is selectively formed.

DESCRIPTION OF THE PRIOR ART

It is well known that a passivation film may be formed on a semiconductor surface in order to protect the surface of the device from the external environment. For example, $SiO_2$, $Si_3N_4$ or pure polycrystalline silicon is generally used for a passivation film. $SiO_2$ is apt to be influenced by external ions, for example Na+, which induces an inversion layer at the surface of the substrate, and has poor moisture-resistivity.

The surface region of Si is apt to be distorted due to the difference between the thermal expansion coefficients of $Si_3N_4$ and the semiconductor substrate.

The leakage currents flow between two regions forming a PN junction, which is biased reversely in operation, through the pure polycrystalline silicon covering the PN junction.

In one form of prior arrangement, for example, an IG-FET, shown in FIG. 1A, the source 1 and drain 2 regions of highly doped N-type semiconductor material are formed by diffusion on a common silicon substrate 3 of P-type.

A polycrystalline silicon layer 4 containing oxygen having a thickness of 5000 Å, is formed by chemical vapor deposition on a substrate 3, and a $SiO_2$ layer 5 of 5000 Å, is formed on the epitaxial layer 4.

In FIG. 1B, an etching mask 5, such as $SiO_2$ is selectively etched by a photo-etching technique and a window 6 is opened.

In FIG. 1C, the polycrystalline layer 4 which is exposed in the window 6 is selectively etched as shown at 7.

Since the polycrystalline silicon 4 and the silicon substrate 3 have common chemical characteristics, the etchant etches the substrate 3 as well as the polycrystalline silicon layer 4, which causes the substrate 3 to be slightly etched while opening the window 7 in the polycrystalline silicon layer 4.

In FIG. 1D, an oxide such as a coating of $SiO_2$ 8, suitable for an insulating gate oxide, is formed on the surface of the substrate 3 exposed in the window 7 by thermal oxidation to a thickness of 1000 to 1500 Å.

The contact holes (not shown) for the source 1 and the drain 2 are formed by an etching technique through the $SiO_2$ layer 5 and the polycrystalline silicon layer 4 to the highly doped N-type source 1 and drain 2 regions.

This prior method of making the IG-FET, shown in FIGS. 1A to 1D, however, has one objection, namely, it is difficult to control the extent of etching of the polycrystalline silicon layer 4 because the layer 4 and the substrate 3 have common chemical characteristics.

Since the surface of the substrate 3 is simultaneously overetched on etching the polycrystalline silicon layer 4, the surface of it for the gate or the ohmic contact is apt to be rough. This leads to a high concentration of surface states in the interface between the thermal formed oxide layer 8 and the substrate, which causes the $V_{th}$ (threshold voltage) to be unstable. In the case of shallow junctions, aluminum diffuses through the P-N junction between one region and the other, which causes the adjacent regions to be short-circuited.

SUMMARY OF THE INVENTION

The present invention comprises a novel method for fabricating a semiconductor device having a passivation film of polycrystalline silicon which contains 2 to 45 atomic percent of oxygen atoms and a silicon dioxide layer over the polycrystalline silicon on the substrate.

The device is formed by oxidizing the portion of the polycrystalline silicon film exposed in the window mask of a thick oxide.

An object of this invention is to provide an improved semiconductor device.

Another object of this invention is to provide a novel method of forming a semiconductor device suitable for use as an insulating gate field effect transistor (IG-FET).

Still another object of this invention is to provide a semiconductor device having good ohmic contacts.

DESCRIPTION OF THE PREFERRED EMBODIMENTS

This invention relates to a method for manufacturing a semiconductor device, and particularly it provides a method most suitable for manufacturing a complementary metal oxide semiconductor integrated circuit and a bipolar transistor.

A $SiO_2$ layer, a $Si_3N_4$ layer and a polycrystalline silicon layer containing no impurity are known as a passivation layer by which a surface of a semiconductor device is stabilized. However, the $SiO_2$ layer is apt to be influenced by external electric charges and lowers the breakdown voltage of the semiconductor device. Moreover, it is not as resistant to moisture. A polycrystalline silicon layer containing no impurity has the disadvantage that leakage currents are apt to flow through such a layer.

A semiconductor device has already been proposed to overcome the above-described disadvantages in U.S. application Ser. No. 561,532, of Takeshi Matsushita; Hisao Hayashi; Teruaki Aoki; Hisayoshi Yamoto and Yoshiyuki Kawana, filed Mar. 24, 1975, which is assigned to the same assignee as the present invention. There is disclosed in this application the fact that a polycrystalline silicon layer containing 2 to 45 atomic percent of oxygen has a good passivation effect, raises the breakdown voltage and improves the reliability. A diffusion layer for a channel stopper is not required in a complementary metal oxide semiconductor integrated circuit using the polycrystalline silicon layer containing 2 to 45 atomic percent of oxygen. Accordingly, the integration density can be raised, and a chip area can be about half of a conventional chip area. Such a semiconductor device has the great advantage that there is scarcely any question of reliability when the semiconductor is operated at a higher voltage.

The method disclosed in application Ser. No. 561,532 will be briefly described for providing a background for the present invention.

Figure 1A:
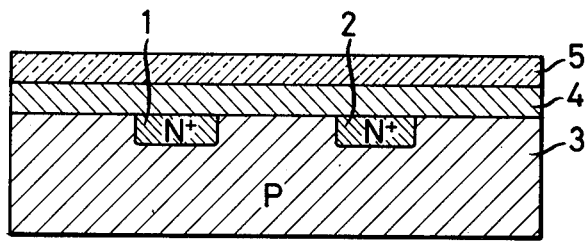
FIGS. 1A to 1D are sectional views diagrammatically illustrating successive steps of forming a prior device.
Figure 1B:
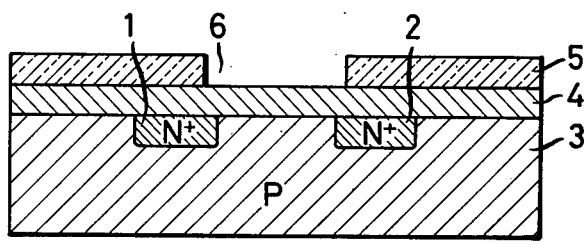

As shown in FIG. 1A, a polycrystalline silicon layer 4 containing a predetermined quantity of oxygen atoms is deposited by a vapor growth method, to the depth of about 5000 Å, on a P-type semiconductor substrate 3 in which N+ type semiconductive regions 1 and 2 are formed by a diffusion method to provide a source and a drain region respectively. A $SiO_2$ layer 5 is then deposited, by a vapor growth method, to a depth of about 5000 Å, on the polycrystalline silicon layer 4. Next, the $SiO_2$ layer 5 is photo-etched at a predetermined portion by a conventional photo-resist masking method, so that an opening 6 for a gate is made in the $SiO_2$ layer 5, as shown in FIG. 1B.

Figure 1C:
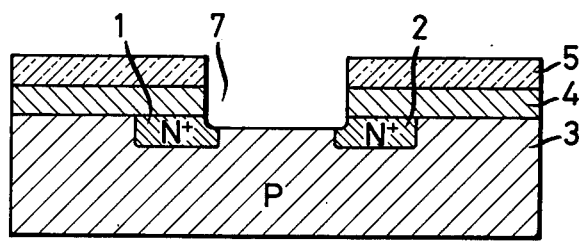

Then, the polycrystalline silicon layer 4 is etched by using the etched $SiO_2$ layer 5 as masking layer. Since polycrystalline silicon and the material (silicon) of the semiconductor substrate are alike in chemical properties, the etching liquid erodes the surface region of the semiconductor substrate 3 in the etching operation. A so-called "overetching" occurs. An opening 7 as shown in FIG. 1C is made in the layers 4 and 5. The surface region of the semiconductor substrate 3 is somewhat overetched at the opening 7.

Figure 1D:
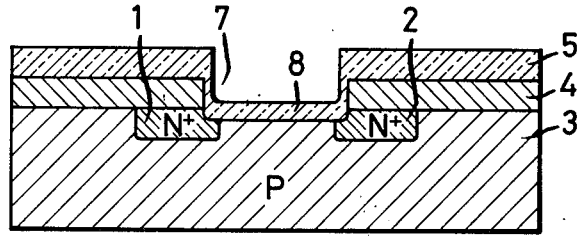

The semiconductor substrate 3 exposed at the opening 7 is then thermally oxidized to form a $SiO_2$ layer 8 as a gate oxidation layer on the exposed semiconductor substrate 3 to the depth of 1000 to 1500 Å, as shown in FIG. 1D. Next, although not shown, openings for forming a source electrode and a drain electrode are made in the $SiO_2$ layer 5 and the polycrystalline silicon layer 4 so as to reach the N+ type semiconductive regions 1 and 2.

In the above-described manufacturing process, it requires a considerable skill to etch only the polycrystalline silicon layer 4, and it is difficult to control the etching operation. Since the surface region of the semiconductor substrate 3 resembles the polycrystalline silicon layer 4 in its chemical properties, it is overetched by the etching liquid, the surface region corresponding to the gate region gets rough and the reproducibility thereof is deteriorated.

The present invention provides an improvement over the invention of the U.S. application, Ser. No. 561,532 without losing the advantages of the latter. A method for manufacturing a semiconductor device according to this invention, comprises the steps of forming a polycrystalline or amorphous silicon layer containing oxygen on a semiconductive single crystal substrate, for example, a silicon single crystal substrate, of forming a masking layer, for example, a $SiO_2$ layer, on the polycrystalline or amorphous silicon layer containing oxygen, of removing partially the masking layer, and of oxidizing the exposed portion of the polycrystalline or amorphous silicon layer.

By the method according to this invention, a semiconductor device having a good passivation effect can be obtained, a manufacturing process can be simplified and the reproducibility can be improved.

The above-described polycrystalline or amorphous silicon layer contains preferably 2 to 45 atomic percent of oxygen and it is more preferable to have 10 to 30 atomic percent of oxygen. When the polycrystalline or amorphous silicon layer contains 13 to 20 atomic percent of oxygen, a particularly fine effect can be obtained. When the polycrystalline or amorphous silicon layer contains too small a quantity of oxygen atoms, a reverse leakage current flows. And when the polycrystalline or amorphous silicon layer contains too large a quantity of oxygen atoms, the effect is no different than the effect obtained from a $SiO_2$ layer. The polycrystalline or amorphous silicon layer comprises grains under the size of 1000 Å. When the grain size is too large, there is the possibility that charges are trapped in the passivating layer and so a memory phenomenon occurs. Accordingly, in such a case, it is hard to obtain a satisfactory passivation effect.

Embodiments of this invention will be described with reference to FIG. 2 to FIG. 4. First, one embodiment of this invention will be described with reference to FIG. 2 and FIG. 3, which is applied to a IG-FET.

Figure 2A:
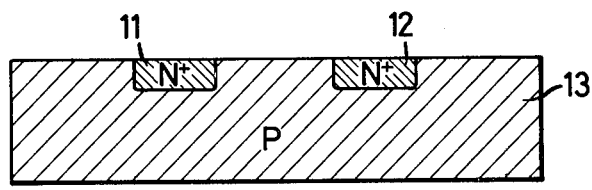
FIGS. 2A to 2E are sectional views diagrammatically illustrating successive steps of forming a preferred embodiment of the novel device of the present invention.

N+ type semiconductive regions 11 and 12 as a source region and a drain region are formed in a P type semiconductor substrate 13 by a diffusion method in which a diffusion mask is used. After the N+ type semiconductive regions 11 and 12 are formed, the diffusion mask is removed, as shown in FIG. 2A.

Figure 2B:
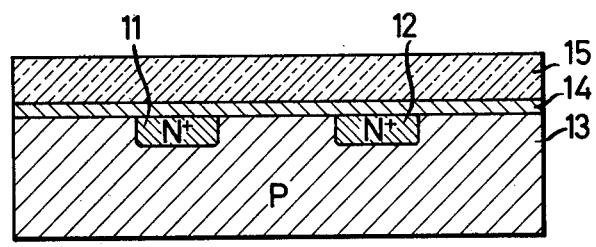
Figure 2C:
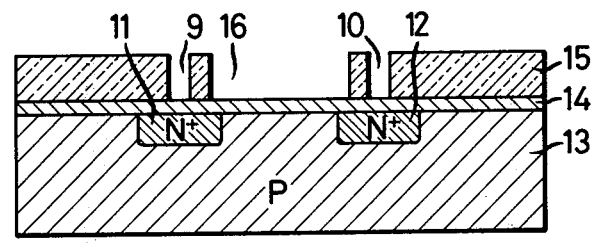
Figure 2D:
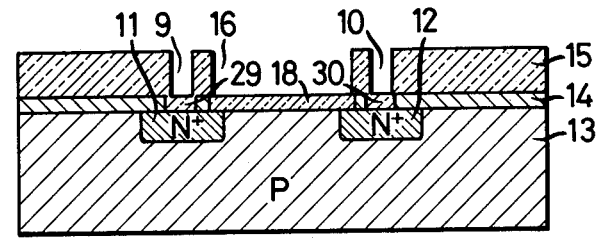
Figure 3:
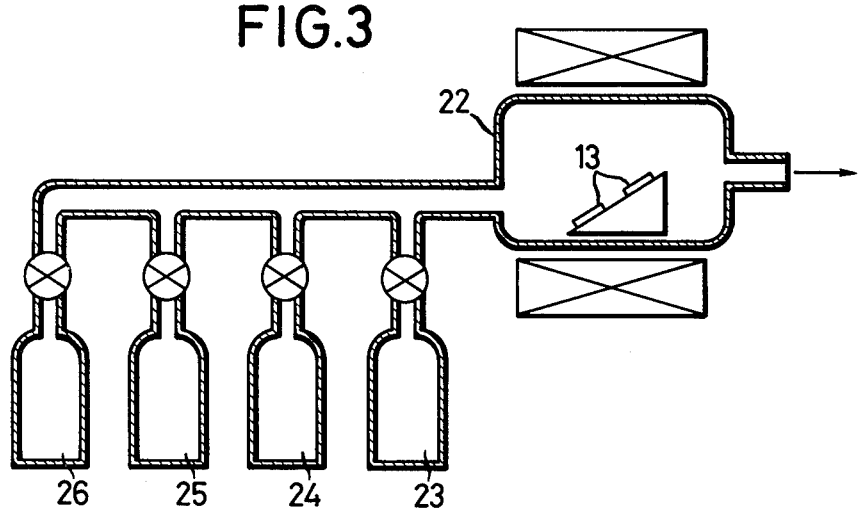
FIG. 3 is a schematic sketch of a vapor deposition apparatus which can be used for the purposes of the present invention.

Next, using the vapor growth apparatus shown in FIG. 3, a polycrystalline silicon layer 14 containing about 35 atomic percent of oxygen is chemically grown on the semiconductor substrate 13 to the depth of about 1000 Å as shown in FIG. 2B. Then, a $SiO_2$ layer 15 is likewise grown on the polycrystalline silicon layer 14 to the depth of about 9000 Å as shown in FIG. 2B. Since the polycrystalline silicon layer 14 becomes partially a gate oxidation layer, as below described, the thickness of the polycrystalline silicon layer 14 is preferably 500 to 1500 Å, and more preferably 1000 to 1200 Å. The added thickness of the $SiO_2$ layer 15 and the polycrystalline silicon layer 14 is designed to be about 1 micron in this embodiment. It is preferably under 2 microns in consideration of the satisfactory formation of the electrodes filling the openings of the layers 14 and 15. Next, only the $SiO_2$ layer 15 is partially removed by a conventional photo-etching method to form openings 9, 10 and 16, as shown in FIG. 2C. The portions of the polycrystalline silicon layer 14 exposed in the openings 9, 10 and 16 are thermally oxidized to form $SiO_2$ layers 29, 30 and 18, to the depth of about 1000 Å in the area defined by the openings 9, 10 and 16. The rate of thermal oxidation of the polycrystalline silicon layer 14 to form the $SiO_2$ layers 29, 30 and 18 is lower than that of thermal oxidation of the silicon semiconductor substrate to $SiO_2$. However, since the polycrystalline silicon layer 14 is previously doped with about 35 atomic percent of oxygen atoms, the thickness of the polycrystalline silicon layer 14 is scarcely increased with the above-described thermal oxidation.

Since the polycrystalline silicon by chemical vapor deposition (CVD) has low density characteristics, the oxide layer of silicon decreases by about 20% in thickness.

It is well known that the silicon dioxide increases by about 35% in thickness compared with the single crystal silicon.

Accordingly, the oxide of the same thickness as the above mentioned polycrystalline silicon layer can be attained under moderate oxidizing conditions.

Moreover, there is low concentration of surface states in the interface between the oxide and the substrate.

Next, in order to form openings for a source electrode and a drain electrode, predetermined portions of the SiO₂ layers 29, 30 are removed by a conventional photo-etching method.

Figure 2E:
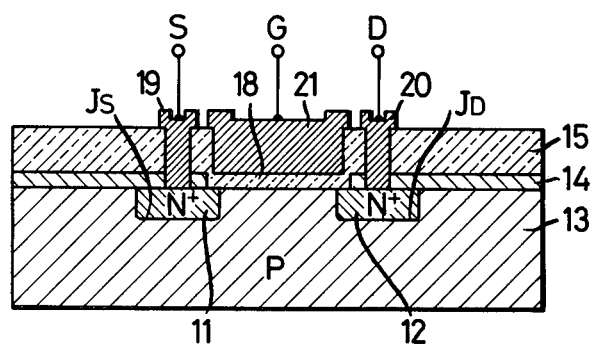

Then, the obtained openings are filled with a source electrode 19 and a drain electrode 20, and a gate electrode 21 is deposited on the gate oxidation layer 18 through the opening 16, as shown in FIG. 2E.

In a manufacturing method according to one embodiment of this invention, the gate oxidation layer can be obtained by the oxidation of the polycrystalline silicon layer 14 exposed in the opening 16. The etching operation should be controlled so that the surface region of the semiconductor substrate is not etched. Since the gate oxidation layer can be formed on the semiconductor substrate without exposing the semiconductor substrate, the surface region of the semiconductor substrate under the SiO₂ layer 18 remains unroughened.

The polycrystalline silicon layer 14 covers all of the source junction Js and the drain junction $J_D$ exposed at the surface of the semiconductor substrate, except the source junction $J_S$ and the drain junction $J_D$ formed in the gate region. In other words, the polycrystalline silicon layer 14 covers the field portions of the semiconductor substrate. Accordingly, when another IG-FET of the opposite conductivity type (not shown) is formed adjacent to the IG-FET of FIG. 2E in the semiconductor substrate to form a so-called complementary type IG-FET in the latter, an unexpected channel due to an inversion layer in the surface region of the semiconductor substrate is avoided. Because a polycrystalline silicon layer containing a predetermined quantity of oxygen atoms is scarcely affected by external electric charges it can avoid memory phenomenon. Accordingly, it is unnecessary to form a diffusion region as a channel stopper between the two IG-FETs, so that the integration density can be raised. Since the thickness of the polycrystalline silicon layer 14 of the field portions is relatively small, the parasitic threshold voltage is lower. However, the parasitic threshold voltage is over 30 volt, and so the thickness of the polycrystalline silicon layer 14 is unimportant.

Moreover, since the SiO₂ layer 15 is formed on the polycrystalline silicon layer 14, better insulation can be obtained between the electrodes 19, 20 and 21 or connections of them and the semiconductor substrate 13. The reliability can be improved, and the breakdown voltage can be raised.

Next, a method for forming the polycrystalline silicon layer 14 according to one embodiment of this invention will be described in detail with reference to FIG. 3.

The apparatus shown in FIG. 3 is normally used in a chemical vapor deposition method (CVD method). A furnace 22 is connected to tanks 23, 24, 25 and 26 for supplying predetermined gases, through adjustable valves and flow meters. The furnace 22 contains the semiconductor substrates 13 shown in FIG. 2A which are heated to a temperature of about 650° C by a heater surrounding the furnace 22. The temperature of about 650° C is for the case where mono-silane (SiH₄) is used as a supply source of silicon. When any silane gas other than mono-silane is used, the heating temperature is decided in consideration of the reaction temperature of such other silane gas. Mono-silane (SiH₄) from the first tank 23, nitrogen oxide, for example, dinitrogen monoxide (N₂O) from the second tank 24, ammonia (NH₃) from the third tank 25, and a carrier gas, for example, nitrogen gas (N₂) from the fourth tank 26 are fed to the furnace 22. For forming the polycrystalline silicon layer 14, a mono-silane (SiH₄), nitrogen monoxide N₂O and the carrier gas are fed onto the semiconductor substrate 13. As a result, mono-silane (SiH₄) and nitrogen monoxide (N₂O) are thermally decomposed to form the polycrystalline silicon layer 14 doped with oxygen from nitrogen mono-oxide (N₂O). The concentration of oxygen atoms in the polycrystalline silicon layer can be decided by the flow ratio of N₂O to SiH₄. In this embodiment, the flow ratio of N₂O to SiH₄ is about ⅔ and the polycrystalline silicon layer 14 contains about 35 atomic percent of oxygen atoms. Instead of N₂O, NO₂ or NO may be used to supply oxygen to the polycrystalline silicon layer. The flow ratio of NO₂ or NO can be easily controlled to obtain the preferable concentration of oxygen. For successively forming the SiO₂ layer 15 on the polycrystalline silicon layer 14, oxygen gas is supplied into the furnace 22 instead of N₂O gas.

Next, another embodiment of this invention will be described with reference to FIGS. 4A to 4E for the fabrication of a bi-polar transistor.

Figure 4A:
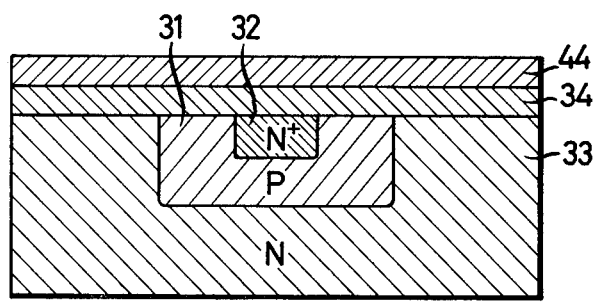
FIGS. 4A to 4E are sectional views diagrammatically illustrating successive steps of forming another embodiment of the present invention.

First, with reference to FIG. 4A, a P type semiconductive region 31 as a base region and an N+ type semiconductive region 32 as an emitter region are formed in an N-type semiconductor substrate 33 by a conventional diffusion method using a SiO₂ layer (not shown) as a mask. The masking SiO₂ layer is removed. A polycrystalline silicon layer 34 containing a predetermined quantity of oxygen atoms is formed on the surface of the semiconductor substrate 33, and successively a polycrystalline silicon layer 44 containing a predetermined quantity of nitrogen is formed on the polycrystalline silicon layer 34 containing oxygen. The polycrystalline silicon layer 34 is preferably about 5000 Å thick and contains about 15 atomic percent of oxygen. The polycrystalline silicon layer 44 is about 2000 Å thick and contains about 50 atomic percent of nitrogen.

Figure 4B:
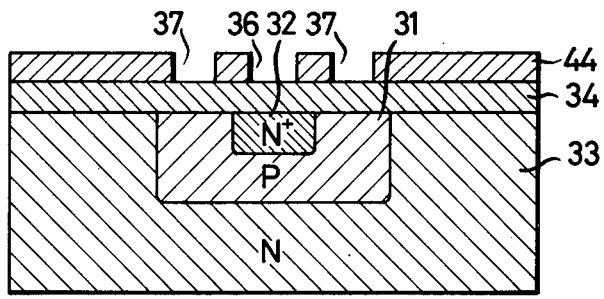

Next, predetermined portions of the polycrystalline silicon layer 44 are removed by using a masking SiO₂ layer (not shown) and pyrophosphoric (H₃PO₄) acid as an etchant. Thus, openings 36 and 37 are made in the polycrystalline silicon layer 44, as shown in FIG. 4B.

Figure 4C:
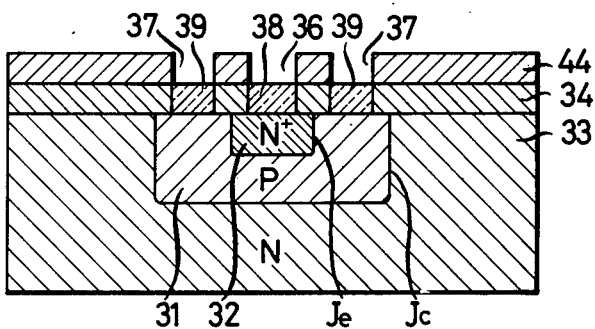

Next, the portions of the polycrystalline silicon layer 34 which are exposed in the openings 36 and 37 are thermally oxidized to form SiO₂ layers 38 and 29, as shown in FIG. 4C. It is necessary that the portion of the PN-junction $J_C$ between the base and collector exposed in the semiconductor substrate 33, to be reversely biased in operation, be covered with the polycrystalline silicon layers 34 and 44. However, it is not necessarily required that the portion of the PN-junction Je between the emitter and base exposed in the semiconductor substrate 33 be covered with the polycrystalline silicon layers 34 and 44. The exposed portion of the PN-junction Je may be covered with a SiO₂ layer.

Figure 4D:
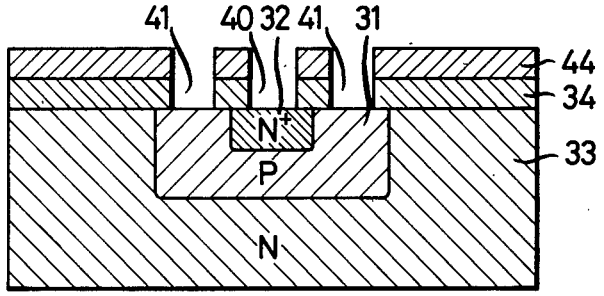

Next, the SiO₂ layers 38 and 39 in the openings 36 and 37 are etched to form openings 40 and 41 which reach the N+ type semiconductive region 32 and the P type semiconductive region 31, respectively, as shown in FIG. 4D. Since the SiO₂ layers 38 and 39 are different from the semiconductor substrate 33 in chemical property, there is scarcely any possibility that the semiconductor substrate 33 will be over-etched by the above described etching operation.

Figure 4E:
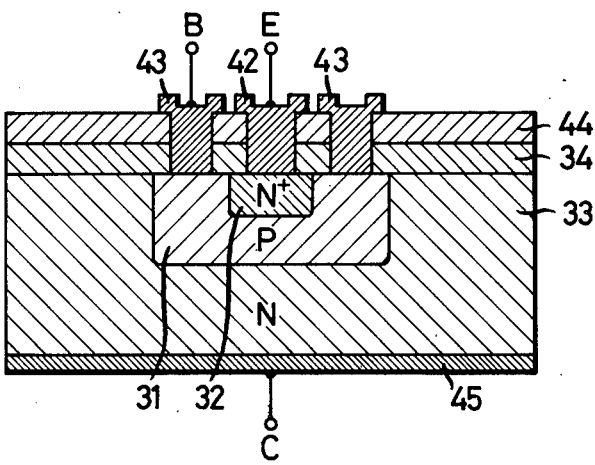

As shown in FIG. 4E, the openings 40 and 41 are filled with an emitter electrode 42 and a base electrode 43. Thus, an NPN type transistor can be obtained.

In the formation of the polycrystalline silicon layer 44 (FIG. 4A), ammonia gas NH₃ from the tank 25 (instead of N₂O from the tank 24), mono-silane SiH₄ and the carrier gas are supplied into the furnace 22, in the apparatus shown in FIG. 3. Also in this case, the semiconductor substrate 33 of FIG. 4A is heated to a temperature of about 650° C to form the polycrystalline silicon layer 44 containing nitrogen N from NH₃. The concentration of nitrogen atoms in the polycrystalline silicon layer 44 can be selected in the range of 10 to 57 atomic percent by the flow ratio of NH₃ to SiH₄. In this embodiment, the flow ratio of NH₃ to SiH₄ is about 100/30 and the polycrystalline silicon layer 44 contains about 50 atomic percent of nitrogen.

For the above-described formation of the polycrystalline silicon layer 34 containing about 15 atomic percent of oxygen, the flow ratio of N₂O to SiH₄ is about 1/6. However, when the polycrystalline silicon layer 34 contains a larger quantity of oxygen atoms, it is more resistive and stable against a high-temperature processing.

It is preferable that the polycrystalline silicon layer 44 contains over 10 atomic percent of nitrogen. A polycrystalline silicon layer containing a smaller quantity of nitrogen is nearly similar to a pure polycrystalline silicon layer on which a dielectric breakdown is apt to occur and which is poorly resistive against moisture. When a SiO₂ layer (not shown as a third passivating layer is formed on the polycrystalline silicon layer 44, the reliability between the electrodes, or connections of them and the semiconductor substrate can be raised still further.

Although the preferred embodiments of this invention have been described, it will be understood that various modifications are possible. For example, the openings may be made in the SiO₂ layer 15 and the polycrystalline silicon layer 44 by a plasma-etching method. Any other suitable material may be used as a material of the masking layer. Of course, this invention may be applied to a mesa-type semiconductor device.

According to this invention, since the polycrystalline silicon layer is selectively oxidized through the opening of the masking layer formed thereon, the oxidized portion of the polycrystalline silicon layer may be used as the gate oxidation layer or it may be etched to form the opening for the electrode.

Accordingly, since there is little or no possibility that the semiconductor substrate will be over-etched, the control of the etching operation can be easily brought about, the process can be simplified and good reproducibility can be obtained, in contrast to the method where the polycrystalline silicon layer itself is removed by the etching operation.

Since the remaining polycrystalline silicon layer containing oxygen is formed on the semiconductor substrate in the completed semiconductor device, the latter is scarcely affected by external electric charges, its breakdown voltage increases, the leakage current decreases and high reliability can be obtained.

It will be apparent to those skilled in the art that many modifications and variations may be effected without departing from the spirit and scope of the novel concepts of the present invention.

We claim as our invention:

1. A method for the manufacture of a semiconductor device comprising:
   a. forming a polycrystalline silicon layer containing 2 to 45 atomic percent of oxygen atoms on a semiconductive single crystal substrate,
   b. forming a masking layer on said polycrystalline silicon layer,
   c. removing partially said masking layer in predetermined areas to provide windows through said masking layer to said polycrystalline layer,
   d. oxidizing the exposed portions of said polycrystalline silicon layer, and
   e. forming an electrode on the oxidized portion below one of the windows.

2. A method for the manufacture of a semiconductor device comprising:
   a. forming a polycrystalline silicon layer containing 2 to 45 atomic percent of oxygen atoms on a semiconductive single crystal substrate,
   b. forming a masking layer on said polycrystalline silicon layer,
   c. removing partially said masking layer in predetermined areas to provide windows through said masking layer to said polycrystalline layer,
   d. oxidizing the exposed portions of said polycrystalline silicon layer, and
   e. removing said oxidized portions below at least two of said windows and forming electrodes on the substrate where the oxidized portions have been removed.

3. A method for the manufacture of an insulating gate field effect transistor comprising:
   a. forming at least two regions of a second conductivity type separately on a substrate of a first conductivity type;
   b. forming a polycrystalline silicon layer containing 2 to 45 atomic percent of oxygen atoms on said substrate;
   c. forming a masking layer on said polycrystalline silicon layer;
   d. removing said masking layer above said two regions to provide windows through said masking layer and removing said masking layer above the surface layer between said two regions;
   e. oxidizing the exposed portions of said polycrystalline silicon layer;
   f. removing said oxidized layer corresponding to said two regions; and
   g. forming electrodes to said two regions and on said oxidized portion at least corresponding to said surface layer between said two regions.

4. A method for the manufacture of a bipolar transistor comprising:
   a. forming at least one region of the second conductivity type on a substrate of the first conductivity type;
   b. forming another region of the first conductivity type in said one region;
   c. forming a polycrystalline silicon layer containing 2 to 45 atomic percent of oxygen atoms on said substrate;
   d. forming a masking layer on said polycrystalline silicon layer;
   e. removing said masking layer corresponding to said region and said another region;
   f. oxidizing the exposed portions of said polycrystalline silicon layer;
   g. removing said oxidized layers corresponding to said regions; and
   h. forming electrodes to said regions.

5. A method according to claim 1, in which said masking layer is a layer of silicon dioxide which is thicker than said polycrystalline silicon layer.

6. A method according to claim 3, in which said masking layer is a layer of silicon dioxide which is thicker than said polycrystalline silicon layer.

7. A method according to claim 4, in which said masking layer is a layer of silicon dioxide which is thicker than said polycrystalline silicon layer.

8. A method according to claim 1, in which said masking layer is a polycrystalline layer containing 10 to 57 atomic percent of nitrogen atoms.

9. A method according to claim 3, in which said masking layer is a polycrystalline layer containing 10 to 57 atomic percent of nitrogen atoms.

10. A method according to claim 4, in which said masking layer is a polycrystalline layer containing 10 to 57 atomic percent of nitrogen atoms.

* * * * *